United States Patent
Kim et al.

(10) Patent No.: US 12,355,457 B2
(45) Date of Patent: Jul. 8, 2025

(54) SEMICONDUCTOR DEVICE

(71) Applicant: Samsung Electronics Co., Ltd., Suwon-si (KR)

(72) Inventors: Joo-Han Kim, Suwon-si (KR); Beom Kon Kim, Suwon-si (KR); Woo Wan Wang, Suwon-si (KR); Dong Hyun Lee, Suwon-si (KR); Jung Su Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 217 days.

(21) Appl. No.: 18/334,744

(22) Filed: Jun. 14, 2023

(65) Prior Publication Data

US 2024/0056088 A1    Feb. 15, 2024

(30) Foreign Application Priority Data

Aug. 9, 2022  (KR) .................. 10-2022-0099259

(51) Int. Cl.
| | |
|---|---|
| H03M 1/06 | (2006.01) |
| H03M 1/10 | (2006.01) |
| H03M 1/12 | (2006.01) |
| H03M 1/50 | (2006.01) |

(52) U.S. Cl.
CPC ........ *H03M 1/0607* (2013.01); *H03M 1/1023* (2013.01); *H03M 1/1245* (2013.01); *H03M 1/50* (2013.01)

(58) Field of Classification Search
CPC .... H03M 1/0607; H03M 1/50; H03M 1/1245; H03M 1/1023
See application file for complete search history.

(56) References Cited

U.S. PATENT DOCUMENTS

| | | | |
|---|---|---|---|
| 7,084,793 B2 | 8/2006 | Elbornsson | |
| 7,482,956 B2 | 1/2009 | Huang et al. | |
| 8,604,952 B2 | 12/2013 | Kidambi et al. | |
| 9,154,147 B2 | 10/2015 | Biallais et al. | |
| 9,401,726 B2 | 7/2016 | Ragab et al. | |
| 9,577,655 B2 | 2/2017 | Taluja et al. | |
| | (Continued) | | |

FOREIGN PATENT DOCUMENTS

| | | |
|---|---|---|
| KR | 101691367 B1 | 12/2016 |
| KR | 101722910 B1 | 4/2017 |

*Primary Examiner* — Joseph J Lauture
(74) *Attorney, Agent, or Firm* — Harness, Dickey & Pierce, P.L.C.

(57) ABSTRACT

A semiconductor device includes a first ADC configured to sample an input signal based on a first clock signal, quantize the input signal with a first gain, and output a plurality of first output signals, and a second ADC configured to sample the input signal based on a second clock signal obtained by delaying the first clock signal, quantize the input signal with a second gain, and output a plurality of second output signals. The device includes a gain mismatch estimator configured to calculate first and second values which are averages of absolute values of the first output signals and the second output signals, and calculate first and second gain correction values using the first and second values. A gain mismatch compensator is configured to output a plurality of corrected first output signals and corrected second output signals, according to the first and second gain correction values.

20 Claims, 4 Drawing Sheets

(56) References Cited

U.S. PATENT DOCUMENTS

| | | |
|---|---|---|
| 10,326,462 B2 | 6/2019 | Taluja et al. |
| 2012/0075129 A1 | 3/2012 | Kidambi |
| 2014/0152477 A1* | 6/2014 | Lewis ................. H03M 1/1061 |
| | | 341/122 |
| 2021/0409032 A1 | 12/2021 | Bal et al. |

* cited by examiner

SEMICONDUCTOR DEVICE

CROSS-REFERENCE TO RELATED APPLICATION

This application claims priority from Korean Patent Application No. 10-2022-0099259 filed on Aug. 9, 2022 in the Korean Intellectual Property Office, and all the benefits accruing therefrom under 35 U.S.C. 119, the contents of which in its entirety are herein incorporated by reference.

FIELD

Some example embodiments of the inventive concepts relate to a semiconductor device.

BACKGROUND

A system that processes a large amount of data such as millimeter wave (mmW) signals may use an analog-to-digital converter (ADC) that supports a high sampling rate.

Since there is a limit in processing data using a single ADC, a time interleaved ADC (TI-ADC) is used, which is used with a timing error between multiple ADCs.

However, in a TI-ADC, gain mismatch or sampling timing offset between ADC cores may occur, which may deteriorate a signal to noise and distortion ratio (SNDR) of a received signal. Therefore, research for improving the above mentioned problems is desired.

SUMMARY

Some example embodiments of the inventive concepts provide a semiconductor device including a TI-ADC having improved quality of an output signal.

However, example embodiments are not restricted to those set forth herein. The above and other example embodiments of the inventive concepts will become more apparent to one of ordinary skill in the art to which the inventive concepts pertain by referencing the detailed description of the example embodiments given below.

According to some example embodiments of the inventive concepts, a semiconductor device includes a first analog-to-digital converter (ADC) configured to sample an input signal based on a first clock signal, quantize the input signal sampled based on the first clock signal with a first gain, and output a plurality of first output signals, and a second ADC configured to sample the input signal based on a second clock signal obtained by delaying the first clock signal by a sampling duration, quantize the input signal sampled based on the second clock signal with a second gain, and output a plurality of second output signals. The device includes a gain mismatch estimator configured to calculate a first value that is an average value of absolute values of the plurality of first output signals, calculate a second value that is an average value of absolute values of the plurality of second output signals, and calculate a first gain correction value using the first value and a second gain correction value using the second value, and a gain mismatch compensator configured to output a plurality of corrected first output signals, each corrected first output signal calculated according to the first gain correction value and an output of the first ADC, and output a plurality of corrected second output signals, each corrected second output signal calculated according to the second gain correction value and an output of the second ADC.

According to some example embodiments of the inventive concepts, a semiconductor device includes a first analog-to-digital converter (ADC) configured to sample an input signal based on a first clock signal, quantize the input signal sampled based on the first clock signal with a first gain, and output a plurality of first output signals, and a second ADC configured to sample the input signal based on a second clock signal obtained by delaying the first clock signal by a sampling duration, quantize the input signal sampled based on the second clock signal with a second gain, and output a plurality of second output signals. The device includes a timing offset estimator configured to calculate a first value that is an average value of absolute values of differences between the plurality of first output signals, calculate a second value that is an average value of absolute values of differences between the plurality of second output signals and the plurality of first output signals, and calculate a sampling timing offset of the second ADC using the first value and the second value, and a timing offset compensator configured to perform timing offset compensation for the second ADC using the sampling timing offset of the second ADC.

According to some example embodiments of the inventive concepts, a semiconductor device includes a first analog digital converter (ADC) configured to sample an input signal based on a first clock signal, quantize the input signal sampled based on the first clock signal with a first gain, and output a plurality of first output signals, and a second ADC configured to sample the input signal based on a second clock signal obtained by delaying the first clock signal by a sampling duration, quantize the input signal sampled based on the second clock signal with a second gain, and output a plurality of second output signals. The device includes a gain mismatch estimator configured to calculate a first value that is an average value of absolute values of the plurality of first output signals, calculate a second value that is an average value of absolute values of the plurality of second output signals, and calculate a first gain correction value and a second gain correction value using the first value and the second value, and a timing offset estimator configured to calculate a third value that is an average value of absolute values of differences between the plurality of first output signals, calculate a fourth value that is an average value of absolute values of differences between the plurality of second output signals and the plurality of first output signals, and calculate a sampling timing offset of the second ADC using the third value and the fourth value.

BRIEF DESCRIPTION OF THE DRAWINGS

The above and other features of the inventive concepts will become more apparent by describing in detail some example embodiments thereof with reference to the attached drawings, in which.

DETAILED DESCRIPTION

Hereinafter, some example embodiments of the inventive concepts will be described with reference to the accompanying drawings.

Figure 1:
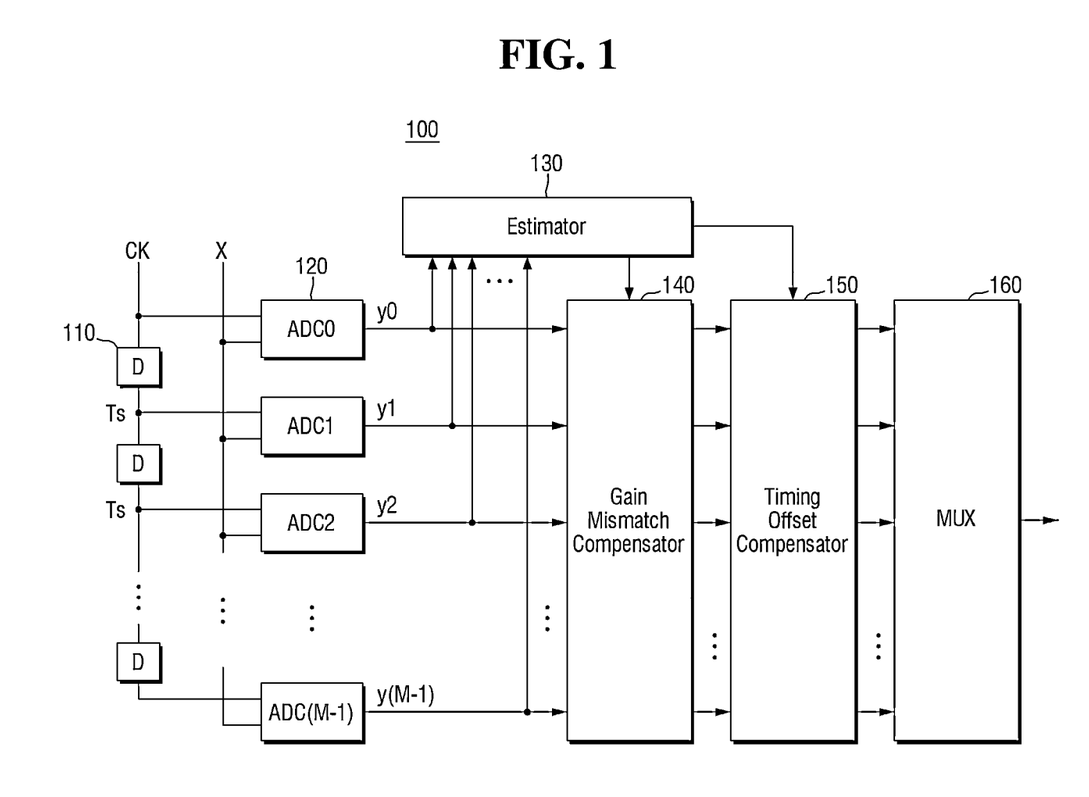
FIG. 1 is a diagram of a semiconductor device according to some example embodiments.
Figure 2:
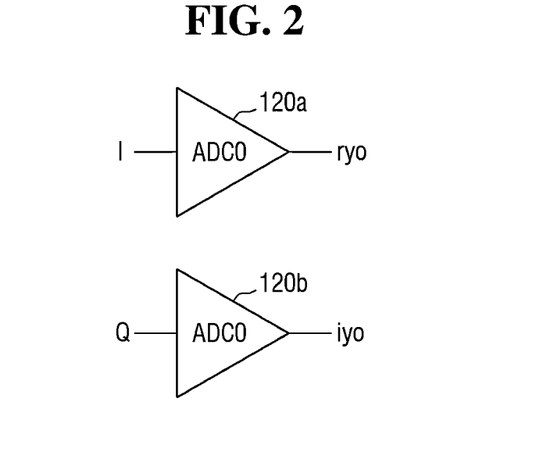
FIG. 2 is an example diagram of an ADC of FIG. 1.
Figure 3:
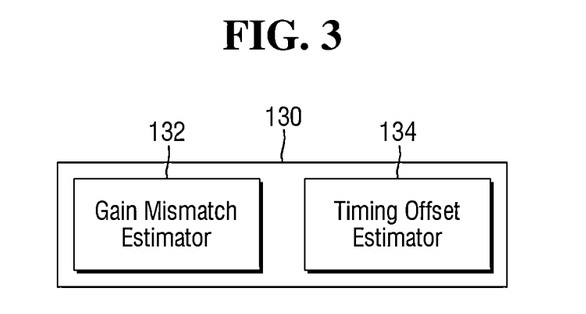
FIG. 3 is an example diagram of an estimator of FIG. 1.

FIG. 1 is a diagram of a semiconductor device according to some example embodiments. FIG. 2 is an example diagram of an ADC of FIG. 1. FIG. 3 is an example diagram of an estimator of FIG. 1.

Referring to FIG. 1, a semiconductor device 100 may include a plurality of ADCs 120, an estimator 130, a gain mismatch compensator 140, a timing offset compensator 150, and a multiplexer 160.

The plurality of ADCs 120 may be, for example, a time interleaved ADC (TI-ADC), which is used with a timing error between multiple ADCs. In some example embodiments, the semiconductor device 100 may be a device that generates a digital signal from an input analog signal using the TI-ADC, but example embodiments are not limited thereto.

The semiconductor device 100 may include a plurality of delay units 110 for providing different clocks to the plurality of ADCs 120.

Each delay unit 110 may delay a sampling clock CK (e.g., a clock signal) by a sampling duration Ts. Accordingly, the ADC (ADC0) may sample an input signal x based on the sampling clock CK, the ADC (ADC1) may sample the input signal x based on a clock obtained by delaying the sampling clock CK by the sampling duration Ts, and the ADC (ADC2) may sample the input signal x based on a clock obtained by delaying the sampling clock CK by twice the sampling duration Ts. When the semiconductor device 100 includes M (e.g., M is a natural number greater than or equal to 2) ADCs 120 as illustrated, the ADC (ADC(M−1)) may sample the input signal x based on a clock obtained by delaying the sampling clock CK by (M−1) times the sampling duration Ts.

Each ADC 120 may quantize and output the sampled input signal x with a gain of each ADC. That is, the ADC (ADC0) may sample the input signal x based on the sampling clock CK, quantize the input signal x with a gain of the ADC (ADC0), and output an output signal y0, and the ADC (ADC1) may sample the input signal x based on the clock obtained by delaying the sampling clock CK by the sampling duration Ts, and quantize the input signal x with a gain of the ADC (ADC1), and output an output signal y1.

The ADC (ADC2) may sample the input signal x based on a clock obtained by delaying the sampling clock CK by twice the sampling duration Ts, quantize the input signal x with a gain of the ADC (ADC2), and output an output signal y2, and the ADC (ADC(M−1)) may sample the input signal x based on a clock obtained by delaying the sampling clock CK by (M−1) times the sampling duration Ts, quantize the input signal x with a gain of the ADC (ADC(M−1)), and output an output signal y(M−1).

Referring to FIG. 2, in some example embodiments, each of the plurality of ADCs 120 may include a real ADC core 120a and an image ADC core 120b. Although FIG. 2 illustrates only one ADC (ADC0) among the plurality of ADCs 120 of FIG. 1, other ADCs may also have the same configuration.

The input signal (x in FIG. 1) may include an I signal I and a Q signal Q, and each of the plurality of ADCs 120 may include a real ADC core 120a for processing the I signal I and an image ADC core 120b for processing the Q signal Q. Accordingly, the output signal (e.g., y0 in FIG. 1) of the ADC (e.g., ADC0 in FIG. 1) may include an output signal ry0 output from the real ADC core 120a and an output signal iy0 output from the image ADC core 120b.

Referring back to FIG. 1, the estimator 130 may receive the output signals y0 to y(M−1) from the plurality of ADCs 120, and may estimate a correction value for compensating for a gain mismatch between the plurality of ADCs 120 and a correction value for compensating for a timing offset between the plurality of ADCs 120.

Referring to FIG. 3, in some example embodiments, the estimator 130 may include a gain mismatch estimator 132 and a timing offset estimator 134.

The gain mismatch estimator 132 may calculate an average value of absolute values of the output signals y0 to y(M−1) output from the plurality of ADCs (e.g., 120 in FIG. 1), and may estimate gain correction values for compensating for the respective gains of the plurality of ADCs (120 of FIG. 1) based on the calculation result.

The timing offset estimator 134 may estimate timing offsets of the plurality of ADCs (120 in FIG. 1) by determining a reference ADC among the plurality of ADCs (120 in FIG. 1), and comparing a timing offset calculated from the output signal of the reference ADC with timing offsets calculated from actual output signals of other ADCs. More detailed operations of the gain mismatch estimator 132 and the timing offset estimator 134 will be described later.

Referring to FIG. 1, the gain mismatch compensator 140 may compensate for the output signals y0 to y(M−1) output by the plurality of ADCs 120 using the gain correction values estimated by the gain mismatch estimator (e.g., 132 in FIG. 3).

The timing offset compensator 150 may perform timing offset compensation for the plurality of ADCs 120 using the timing offset estimated by the timing offset estimator (e.g., 134 in FIG. 3).

Although the estimator 130, the gain mismatch compensator 140, and the timing offset compensator 150 are separately illustrated in FIG. 1, example embodiments are not limited thereto. If desired, the estimator 130, the gain mismatch compensator 140, and the timing offset compensator 150 may be integrally implemented.

The multiplexer 160 may select and output the outputs of the plurality of ADCs 120 compensated by the gain mismatch compensator 140 and the timing offset compensator 150 according to a control signal.

Hereinafter, a gain mismatch compensation operation and a timing offset estimation operation will be described with reference to FIGS. 1, 4, and 5.

First, an output signal output by an m-th ADC among the plurality of ADCs 120 illustrated in FIG. 1 at an n-th sampling may be expressed as follows.

$$y_m[n] = Q(g_m * x_m((nM+m)T_s))$$

Here, m is any one of 0 and M−1, Q( ) is a quantization function, and $g_m$ is a gain of the m-th ADC. $x_m$ is an input signal of the m-th ADC, M is the number of ADCs, and Ts is the sampling duration.

For example, the ADC0 may sample an input signal at a timing with no delay at all at a 0-th sampling, quantize a signal obtained by multiplying the sampled input signal with g0, which is a gain of the ADC0, and output an output signal y0[0]. In addition, the ADC1 may sample an input signal at a timing delayed by Ts at the 0-th sampling, quantize a signal obtained by multiplying the sampled input signal with g1, which is a gain of the ADC1, and output an output signal y1[0].

Next, the ADC0 may sample an input signal at a timing delayed by M×Ts at a first sampling (e.g., the next sampling of the ADC0 is performed after all M ADCs are sampled), quantize a signal obtained by multiplying the sampled input signal with g0, which is a gain of the ADC0, and output an output signal y0[1]. In addition, the ADC1 may sample an input signal at a timing delayed by (M+1)×Ts at the first sampling, quantize a signal obtained by multiplying the sampled input signal with g1, which is a gain of the ADC1, and output an output signal y1[1].

Assuming that the gain of each ADC does not change with time, if there is no gain mismatch between the plurality of ADCs, the gain between the respective ADCs will be the same or substantially the same as follows.

$$g_0 = g_1 = \cdots = g_{M-1}$$

However, when the gain mismatch exists between the plurality of ADCs as follows, a quality of the output signal may be improved by compensating for the gain mismatch.

$$g_0 \neq g_1 \neq \cdots \neq g_{M-1}$$

For such compensation, in some example embodiments, a mismatch value between gm is estimated in the following manner.

An average value of an absolute value of the output signal of an m-th real ADC core (e.g., 120a in FIG. 2) may be expressed as follows.

$$Y_{real,m} = \frac{1}{N/M} \sum_{n=0}^{N/M-1} |\text{Real}(y_m[n])|$$

Here, N is the total number of sampling times of M ADCs.

For example, assuming that two ADCs each perform sampling twice, N, which is the total number of sampling times of the two ADCs, is 4. In addition, |Real($y_m$[n])| is an absolute value of an output signal (e.g., ry0 in FIG. 2) of the real ADC core. Therefore, $Y_{real,m}$ is an average value of absolute values of each of the two output signals output by the real ADC core.

The average value of the absolute values of the output signals of the 0-th or specific m-th real (or image) ADC core obtained through the above equation is set as a reference value, and an average value of the absolute values of the output signals is also obtained for the remaining ADC cores, respectively. Hereinafter, the average value of the absolute values of the output signals of the real ADC core of the ADC0 is set as the reference value.

The average value of the absolute values of the output signals of the real ADC core of the ADC0 is set as the reference value, and the gain correction values of the remaining ADC cores are estimated as follows.

$$G_{real,m} = \frac{Y_{real,0}}{Y_{real,m}}, \quad G_{imag,m} = \frac{Y_{real,0}}{Y_{imag,m}}, \text{ for } m = 0, 1, \ldots, M-1$$

The above equation estimates the gain correction values of the image ADC core of the ADC0, and the real ADC core and the image ADC core of the ADC1 to ADC(M−1) by setting the average value of the absolute values of the output signals of the real ADC core of the ADC0 as the reference value.

Figure 4:
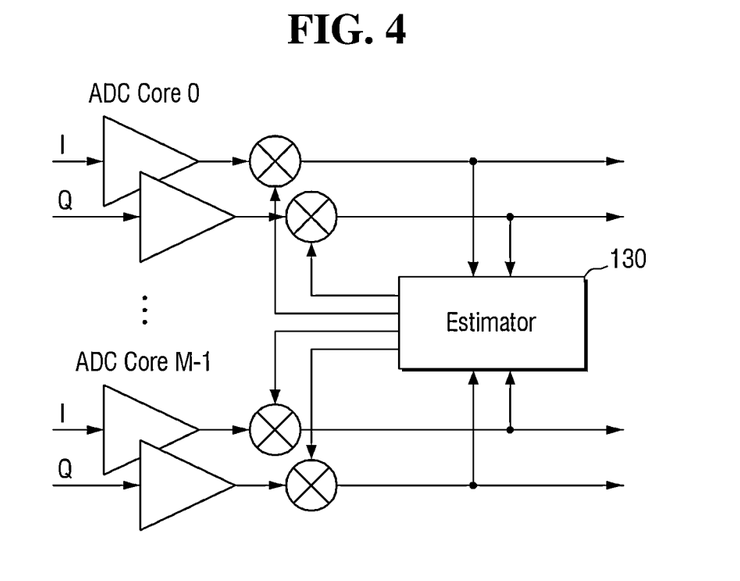
FIG. 4 is a diagram for describing a gain compensation operation through a gain mismatch compensator.

When the gain correction value is calculated for each ADC core as described above, the gain mismatch may be compensated for by calculating the gain correction value with the output of the ADC core as illustrated in FIG. 4.

A multiplier of FIG. 4 is an example of the gain mismatch compensator (140 in FIG. 1), and accordingly, the gain mismatch of the output signal of each ADC core may be compensated. A magnitude of the output signal of the ADC core having a smaller gain than that of the real ADC core of the reference ADC0 increases, and a magnitude of the output signal of the ADC core having a greater gain than that of the real ADC core of the reference ADC0 decreases.

Next, when a sampling timing offset exists in the ADC core, the output of the m-th ADC core may be expressed as follows.

$$y_m[n] = Q(g_m * x_m((nM+m)T_s + \tau_m))$$

Here, $\tau_m$ refers to a sampling timing offset of the m-th ADC core.

Hereinafter, it is assumed that the sampling timings of the real ADC core and the image ADC core are the same or substantially the same. That is, it is assumed that the sampling timings of the real ADC core and the image ADC core included in the ADC0 are the same or substantially the same.

If there is no sampling timing offset, $\tau_m$ is zero.

In order to calculate a reference sampling timing using the output signal of the ADC0, $\Delta_0$ is defined as follows.

$$\Delta_0 = \frac{1}{N/M} \sum_{n=0}^{N/M-1} (|\text{Real}(y_0[n]) - \text{Real}(y_0[n+1])|)$$

Figure 5:
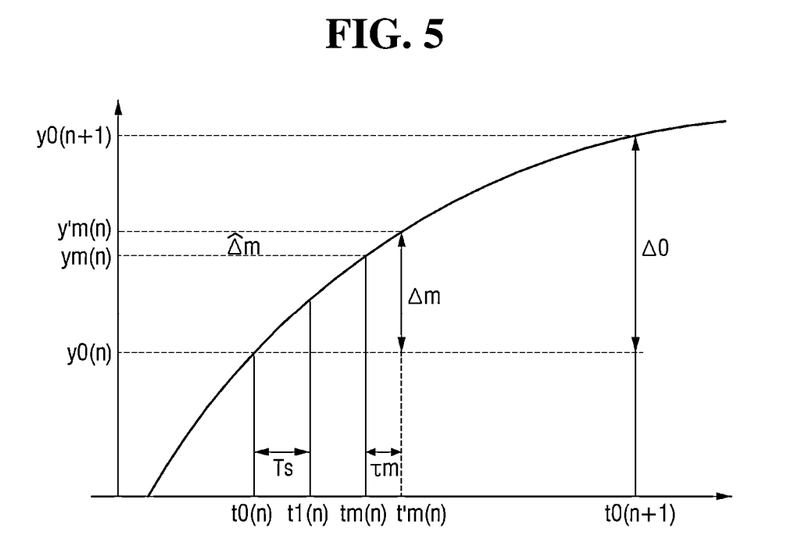
FIG. 5 is a diagram for describing an operation of estimating a timing offset.

Referring to FIG. 5, $\Delta_0$ is an average value of an absolute value of a difference between the output signals of the ADC0. For example, when an output signal output by the ADC0 performing the 0-th sampling at t0(0) on the input signal is y0(0), an output signal output by the ADC0 performing the first sampling at t0(1) on the input signal is y0(1), and an output signal output by the ADC0 performing the second sampling at t0(2) on the input signal is y0(2), $\Delta_0$ is an average value of an absolute value of a difference between y0(2) and y0(1) and an absolute value of a difference between y0(1) and y0(0).

That is, as illustrated in FIG. 5, $\Delta_0$ is an average difference between an output signal y0(n) of the ADC0 at a previous sampling time t0(n) and an output signal y0(n+1) of the ADC0 at a next sampling time t0(n+1). In some example embodiments, the sampling timing offset of another ADC is estimated using such $\Delta_0$ as a reference.

Next, in order to calculate a sampling timing of ADCm, $\Delta_m$ is defined as follows.

$$\Delta_m = \frac{1}{N/M} \sum_{n=0}^{N/M-1} (|\text{Real}(y_0[n]) - \text{Real}(y_m[n])|)$$

Now, a sampling timing offset of the ADCm may be estimated through the following process.

$$\hat{\Delta}_m = \Delta_m - m \cdot \frac{\Delta_0}{M}$$

Referring to FIG. 5, $\hat{\Delta}_m$ is a value indicating how much difference between Ym(n) (that is, the output signal of the ADCm when the ADCm has an ideal sampling timing) calculated by equally dividing $\Delta_0$ by m and an output signal Y'm(n) actually output by the ADCm.

Therefore, when the sampling timing offset of the ADCm does not exist, $\hat{\Delta}_m$ becomes zero. In other words, if the ADCm performs sampling at a point of time tm(n), $\hat{\Delta}_m$ becomes zero.

However, if $\hat{\Delta}_m$ is not zero, the ADCm has a sampling timing offset by performing sample at a point of time t'm(n) instead of at the point of time tm(n), and therefore, the sampling timing offset $\tau_m$ of the ADCm may be estimated through the following equation.

$$\tau_m = \frac{\hat{\Delta}_m}{\Delta_0/M} \cdot T_s$$

The timing offset compensator (e.g., 150 in FIG. 1) may perform timing offset compensation for the ADCm by adjusting the delay unit (e.g., 110 in FIG. 1) or adjusting the ADCm using the sampling timing offset $\tau_m$ of the ADCm calculated as described above.

Figure 6:
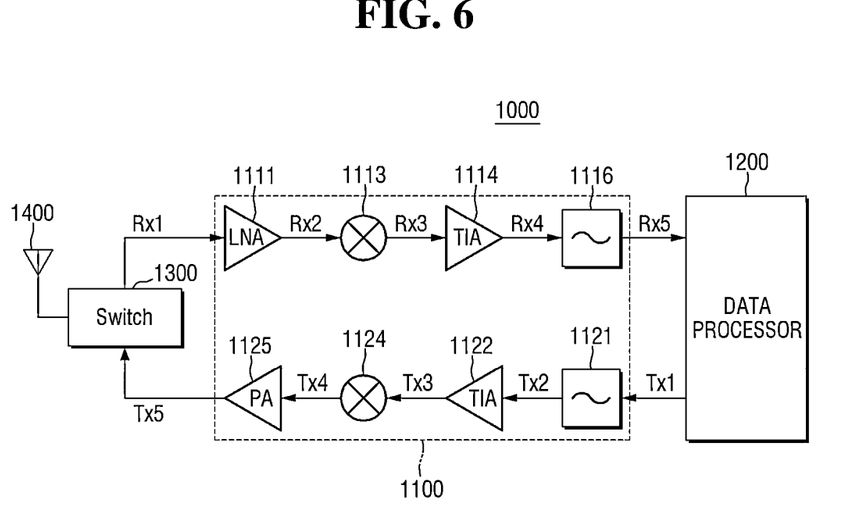
FIG. 6 is a block diagram illustrating a communication device according to some example embodiments.

FIG. 6 is a block diagram illustrating a communication device according to some example embodiments.

Referring to FIG. 6, a communication device 1000 may include a transceiver 1100, a data processor 1200, a switch 1300, and an antenna 1400.

The transceiver 1100 may include a low noise amplifier 1111, a reception mixer 1113, a reception amplifier 1114, a reception filter 1116, a transmission filter 1121, a transmission amplifier 1122, a transmission mixer 1124, and a power amplifier 1125.

In a reception mode, the switch 1300 may output a first reception signal Rx1 received through the antenna 1400 to the low noise amplifier 1111. The low noise amplifier 1111 may amplify the first reception signal Rx1 to generate a second reception signal Rx2. The reception mixer 1113 may generate a third reception signal Rx3 by down-converting the second reception signal Rx2.

The reception amplifier 1114 may generate a fourth reception signal Rx4 by amplifying the third reception signal Rx3. In some example embodiments, the reception filter 1116 may generate a fifth reception signal Rx5 by filtering the fourth reception signal Rx4, and may output the fifth reception signal Rx5 to the data processor 1200.

In some example embodiments, the reception amplifier 1114 may include a trans impedance amplifier (TIA), and the reception amplifier 1114 and the reception filter 1116 may serve to convert a radio frequency (RF) current signal down-converted through the reception mixer 1113 into an intermediate frequency (IF) voltage signal and filter the IF voltage signal.

In a transmission mode, the data processor 1200 may generate a first transmission signal Tx1 and output the first transmission signal Tx1 to the transceiver 1100. The transmission filter 1121 may generate a second transmission signal Tx2 by filtering the first transmission signal Tx1, and the transmission amplifier 1122 may generate a third transmission signal Tx3 by amplifying the second transmission signal Tx2. In some example embodiments, the transmission amplifier 1122 may include a trans impedance amplifier.

The transmission mixer 1124 may generate a fourth transmission signal Tx4 by up-converting the third transmission signal Tx3, and the power amplifier 1125 may generate a fifth transmission signal Tx5 by amplifying the fourth transmission signal Tx4. The switch 1300 may connect the power amplifier 1125 and the antenna 1400 to each other, and the fifth transmission signal Tx5 may be externally output through the antenna 1400.

The semiconductor device (e.g., 100 in FIG. 1) described above may be disposed and operated within the data processor 1200, for example.

One or more of the elements (e.g., the estimator 130) disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Some example embodiments of the inventive concepts have been described above with reference to the accompanying drawings, but the inventive concepts may be implemented in various different forms, and those skilled in the art to which the inventive concepts pertain may understand that the inventive concepts may be implemented in other specific forms without changing the scope of the inventive concepts. Therefore, it should be understood that the example embodiments described above are illustrative in all aspects and not restrictive.

What is claimed is:

1. A semiconductor device comprising:
   a first analog-to-digital converter (ADC) configured to sample an input signal based on a first clock signal, quantize the input signal sampled based on the first clock signal with a first gain, and output a plurality of first output signals;
   a second ADC configured to sample the input signal based on a second clock signal obtained by delaying the first clock signal by a sampling duration, quantize the input signal sampled based on the second clock signal with a second gain, and output a plurality of second output signals;
   a gain mismatch estimator configured to calculate a first value that is an average value of absolute values of the plurality of first output signals, calculate a second value that is an average value of absolute values of the plurality of second output signals, and calculate a first gain correction value using the first value and a second gain correction value using the second value; and
   a gain mismatch compensator configured to output a plurality of corrected first output signals, each of the plurality of corrected first output signals calculated according to the first gain correction value and an output of the first ADC, and output a plurality of corrected second output signals, each of the plurality of corrected second output signals calculated according to the second gain correction value and an output of the second ADC.

2. The semiconductor device of claim 1, wherein the gain mismatch estimator is configured to calculate the second gain correction value by dividing the first value by the second value.

3. The semiconductor device of claim 1, further comprising a third ADC configured to sample the input signal based on a third clock signal obtained by delaying the second clock signal by the sampling duration, quantize the input signal sampled based on the third clock signal with a third gain, and output a plurality of third output signals, wherein
   the gain mismatch estimator is configured to calculate a third value that is an average value of absolute values of the plurality of third output signals, and calculate a third gain correction value using the first value and the third value, and
   the gain mismatch compensator is configured to output a plurality of corrected third output signals, each of the plurality of corrected third output signals calculated according to the third gain correction value and an output of the third ADC.

4. The semiconductor device of claim 3, wherein the gain mismatch estimator is configured to:
calculate the second gain correction value by dividing the first value by the second value, and
calculate the third gain correction value by dividing the first value by the third value.

5. The semiconductor device of claim 1, wherein
the input signal includes an I signal and a Q signal,
the first ADC includes a first ADC core configured to sample the I signal and output a plurality of third output signals, and a second ADC core configured to sample the Q signal and outputs a plurality of fourth output signals,
the second ADC includes a third ADC core configured to sample the I signal and output a plurality of fifth output signals, and a fourth ADC core configured to sample the Q signal and output a plurality of sixth output signals,
the gain mismatch estimator is configured to
calculate a third value that is an average value of absolute values of the plurality of third output signals,
calculate a fourth value that is an average value of absolute values of the plurality of fourth output signals,
calculate a fifth value that is an average value of absolute values of the plurality of fifth output signals,
calculate a sixth value that is an average value of absolute values of the plurality of sixth output signals, and
calculate a third gain correction value using the third value, a fourth gain correction value using the fourth value, a fifth gain correction value using the fifth value, and a sixth gain correction value using the sixth value, and
the gain mismatch compensator is configured to
output a plurality of corrected third output signals, each of the plurality of corrected third output signals calculated according to the third gain correction value and an output of the first ADC core,
output a plurality of corrected fourth output signals, each of the plurality of corrected fourth output signals calculated according to the fourth gain correction value and an output of the second ADC core,
output a plurality of corrected fifth output signals, each of the plurality of corrected fifth output signals calculated according to the fifth gain correction value and an output of the third ADC core, and
output a plurality of corrected sixth output signals, each of the plurality of corrected sixth output signals calculated according to the sixth gain correction value and an output of the fourth ADC core.

6. The semiconductor device of claim 5, wherein the gain mismatch estimator is configured to:
calculate the fourth gain correction value by dividing the third value by the fourth value,
calculate the fifth gain correction value by dividing the third value by the fifth value, and
calculate the sixth gain correction value by dividing the third value by the sixth value.

7. The semiconductor device of claim 1, further comprising a timing offset estimator configured to calculate a third value that is an average value of absolute values of differences between the plurality of first output signals, calculate a fourth value that is an average value of absolute values of differences between the plurality of second output signals and the plurality of first output signals, and calculate a sampling timing offset of the second ADC using the third value and the fourth value.

8. The semiconductor device of claim 7, wherein the timing offset estimator is configured to calculate the sampling timing offset of the second ADC using the third value, the fourth value, and the sampling duration.

9. The semiconductor device of claim 7, further comprising a third ADC configured to sample the input signal based on a third clock signal obtained by delaying the second clock signal by the sampling duration, quantize the input signal sampled based on the third clock signal with a third gain, and output a plurality of third output signals, wherein the timing offset estimator is configured to
calculate a fifth value that is an average value of absolute values of differences between the plurality of third output signals and the plurality of first output signals, and
calculate a sampling timing offset of the third ADC using the third value and the fifth value.

10. A semiconductor device comprising:
a first analog-to-digital converter (ADC) configured to sample an input signal based on a first clock signal, quantize the input signal sampled based on the first clock signal with a first gain, and output a plurality of first output signals;
a second ADC configured to sample the input signal based on a second clock signal obtained by delaying the first clock signal by a sampling duration, quantize the input signal sampled based on the second clock signal with a second gain, and output a plurality of second output signals;
a timing offset estimator configured to calculate a first value that is an average value of absolute values of differences between the plurality of first output signals, calculate a second value that is an average value of absolute values of differences between the plurality of second output signals and the plurality of first output signals, and calculate a sampling timing offset of the second ADC using the first value and the second value; and
a timing offset compensator configured to perform timing offset compensation for the second ADC using the sampling timing offset of the second ADC.

11. The semiconductor device of claim 10, wherein the timing offset estimator is configured to calculate the sampling timing offset of the second ADC using the first value, the second value, and the sampling duration.

12. The semiconductor device of claim 10, further comprising a third ADC configured to sample the input signal based on a third clock signal obtained by delaying the second clock signal by the sampling duration, quantize the input signal sampled based on the third clock signal with a third gain, and output a plurality of third output signals, wherein
the timing offset estimator is configured to calculate a third value that is an average value of absolute values of differences between the plurality of third output signals and the plurality of first output signals, and calculate a sampling timing offset of the third ADC using the first value and the third value, and
the timing offset compensator is configured to perform timing offset compensation for the third ADC by using the sampling timing offset of the third ADC.

13. The semiconductor device of claim 10, further comprising:
a gain mismatch estimator configured to calculate a third value that is an average value of absolute values of the plurality of first output signals, calculate a fourth value that is an average value of absolute values of the plurality of second output signals, and calculate first gain correction value and a second gain correction value using the third value and the fourth value; and a gain mismatch compensator configured to output a plurality of corrected first output signals, each of the plurality of corrected first output signals calculated according to the first gain correction value and an output of the first ADC, and output a plurality of corrected second output signals, each of the plurality of corrected second output signals calculated according to the second gain correction value and an output of the second ADC.

14. The semiconductor device of claim 13, wherein the gain mismatch estimator is configured to calculate the second gain correction value by dividing the third value by the fourth value.

15. The semiconductor device of claim 13, further comprising a third ADC configured to sample the input signal based on a third clock signal obtained by delaying the second clock signal by the sampling duration, quantize the input signal sampled based on the third clock signal with a third gain, and output a plurality of third output signals, wherein the gain mismatch estimator is configured to calculate a fifth value that is an average value of absolute values of the plurality of third output signals, and calculate a third gain correction value using the third value and the fifth value, and the gain mismatch compensator is configured to output a plurality of corrected third output signals, each of the plurality of corrected third output signals calculated according to the third gain correction value and an output of the third ADC.

16. The semiconductor device of claim 15, wherein the gain mismatch estimator is configured to:

calculate the second gain correction value by dividing the third value by the fourth value, and calculate the third gain correction value by dividing the third value by the fifth value.

17. A semiconductor device comprising:

a first analog digital converter (ADC) configured to sample an input signal based on a first clock signal, quantize the input signal sampled based on the first clock signal with a first gain, and output a plurality of first output signals;

a second ADC configured to sample the input signal based on a second clock signal obtained by delaying the first clock signal by a sampling duration, quantize the input signal sampled based on the second clock signal with a second gain, and output a plurality of second output signals;

a gain mismatch estimator configured to calculate a first value that is an average value of absolute values of the plurality of first output signals, calculate a second value that is an average value of absolute values of the plurality of second output signals, and calculate a first gain correction value and a second gain correction value using the first value and the second value; and a timing offset estimator configured to calculate a third value that is an average value of absolute values of differences between the plurality of first output signals, calculate a fourth value that is an average value of absolute values of differences between the plurality of second output signals and the plurality of first output signals, and calculate a sampling timing offset of the second ADC using the third value and the fourth value.

18. The semiconductor device of claim 17, further comprising a third ADC configured to sample the input signal based on a third clock signal obtained by delaying the second clock signal by the sampling duration, quantize the input signal sampled based on the third clock signal with a third gain, and output a plurality of third output signals, wherein the gain mismatch estimator is configured to calculate a fifth value that is an average value of absolute values of the plurality of third output signals, and calculate a third gain correction value using the first value and the fifth value.

19. The semiconductor device of claim 18, wherein the gain mismatch estimator is configured to:

calculate the second gain correction value by dividing the first value by the second value, and calculate the third gain correction value by dividing the first value by the fifth value.

20. The semiconductor device of claim 17, further comprising a third ADC configured to sample the input signal based on a third clock signal obtained by delaying the second clock signal by the sampling duration, quantize the input signal sampled based on the third clock signal with a third gain, and output a plurality of third output signals, wherein the timing offset estimator is configured to calculate a fifth value that is an average value of absolute values of differences between the plurality of third output signals and the plurality of first output signals, and calculate a sampling timing offset of the third ADC using the third value and the fifth value.

* * * * *